United States Patent
Sada et al.

[11] Patent Number: 5,880,016
[45] Date of Patent: Mar. 9, 1999

[54] METHOD FOR ADJUSTING THE CIRCUIT CHARACTERISTIC OF A CIRCUIT BODY BY CUTTING WIRES EXTERNAL TO THE CIRCUIT BODY

[75] Inventors: Ryuichi Sada; Shigemitsu Watanabe, both of Kanagawa, Japan

[73] Assignee: Mitsumi Electric Co., Ltd., Tokyo, Japan

[21] Appl. No.: 961,064

[22] Filed: Oct. 30, 1997

[30] Foreign Application Priority Data

Oct. 31, 1996 [JP] Japan .................................. 8-305601

[51] Int. Cl.⁶ ...................................................... H01L 21/66
[52] U.S. Cl. ........................ 438/598; 438/131; 438/132; 257/48
[58] Field of Search ...................................... 438/462, 131, 438/132, 467, 215, 281, 333, 601, 433, 597, 598; 257/685, 686, 48

[56] References Cited

U.S. PATENT DOCUMENTS

| | | |
|---|---|---|
| 4,689,550 | 8/1987 | Ujihara et al. . |
| 5,279,984 | 1/1994 | Kinoshita et al. . |
| 5,410,163 | 4/1995 | Murakami . |
| 5,502,333 | 3/1996 | Bertin et al. . |
| 5,532,614 | 7/1996 | Chiu . |
| 5,703,381 | 12/1997 | Iwasa et al. . |
| 5,739,718 | 4/1998 | Chevroulet . |

*Primary Examiner*—Charles Bowers
*Assistant Examiner*—Martin Sulsky
*Attorney, Agent, or Firm*—Whitham, Curtis & Whitham

[57] ABSTRACT

Adjusting elements (R1, R2 and R3) are redundantly or preliminarily built in an IC circuit body (5), the adjusting elements (R1, R2 and R3) are connected to one another through conductor patterns (P1, P2 and P3) provided outside the circuit body (5), and after the circuit operating function is confirmed by inspection, the conductor patterns (P1, P2 and P3) are selectively cut to select an adjusting element to be used, thereby to adjust or select a function of the circuit body.

1 Claim, 2 Drawing Sheets

5,880,016

METHOD FOR ADJUSTING THE CIRCUIT CHARACTERISTIC OF A CIRCUIT BODY BY CUTTING WIRES EXTERNAL TO THE CIRCUIT BODY

BACKGROUND OF THE INVENTION

1. Field of the Invention

This invention relates to a circuit characteristic adjusting method which is suitable for adjustment and selection of functions thereof.

2. Related Art

Heretofore, adjustment or selection of the electrical characteristic of a general electronic circuit element is carried out as follows: That is, element components, or suitable element components which can be estimated in an inspection step are mounted on an element component mounting section which is provided redundantly or preliminarily, to adjust the electrical characteristic of the circuit body. Alternatively, it is achieved by connecting wires such as jumper wires. That is, the circuit characteristic is adjusted by attaching element components or the like.

On the other hand, in an IC circuit body, as in the case of a memory or general purpose IC, a wiring pattern on the chip is directly cut, to disconnect a redundant element section or circuit section therefrom, to adjust the circuit characteristic.

In the selection of a function of the above-described general electronic circuit body, at the stage that the functional characteristic can be confirmed it is determined whether or not the functional characteristic is acceptable, and according to the result of determination its components are installed or removed or replaced for adjustment of the circuit characteristic. Hence, the above-described work is considerably intricate. Furthermore, since those components are generally individual (separate) components, it is necessary to provide a space large enough to install them.

On the other hand, a method of cutting a wiring pattern on the chip of an IC circuit for adjustment of the latter, suffers from the following difficulties: Even if the work is carried out after the components together with other components are installed on the substrate, it must be done before the IC circuit is sealed, and therefore the work is low in efficiency and the circuit body is low in protectiveness. In addition, part of the step of handling the IC circuit must be performed in the step of assembling the circuit body. Hence, it is difficult to set up a good circumferential condition for the work. Furthermore, foreign matter may contaminate the IC circuit, sticking to the latter, if there is a delicate element such as a crystal oscillator (described later) near it. That is, when the wiring pattern is cut, foreign matters scattered or remained may adversely affect the delicate element instantaneously or as the environmental condition changes

SUMMARY OF THE INVENTION

In view of the foregoing, an object of the invention is to provide a circuit characteristic adjusting method which is high in adjustment and selection accuracy, is able to adjust the circuit function with ease, eliminates troublesome steps of installing and removing components, and the use of additional components, and is high in protectiveness for other elements.

The foregoing object of the invention has been achieved by the provision of a circuit characteristic adjusting method, in which, according to the invention, adjusting elements are redundantly or preliminarily built in an IC circuit body, the adjusting elements are connected to one another through conductor patterns provided outside the circuit body, and after the operating function of the circuit body is confirmed by inspection, the conductor patterns are selectively cut to select an adjusting element to be used, thereby to adjust or select a function of the circuit body.

In the above-described method, the adjusting elements are redundantly or preliminarily built in the IC circuit body, the adjusting elements thus built in are connected; more specifically, the wiring of the element components to be selected and adjusted in the circuit body is carried out with conductor patterns provided outside the circuit body, for instance on the substrate. That is, under the condition that the connection of desired elements is substantially maintained in the circuit body, and the wiring is maintained selective, the circuit body, and other elements which are delicate against circumferential change are protected by sealing, so that the resultant assembly is confirmable for operating characteristic. After the characteristic of the assembly is confirmed, among the conductor patterns, a suitable one to be cut can be selected and cut. Hence, the space for installation of element components of the circuit body can be reduced as much. Furthermore, the feature makes it possible to achieved the adjusting work with ease.

Furthermore, the wiring of the internal elements of the IC is extended to other suitable parts so that the adjustment work is achieved by cutting the wiring under the condition that the functional characteristic has been fully confirmed. Hence, the adjustment can be achieved without adversely affecting the elements forming the IC circuit, and other elements assembled together with the circuit body.

DETAILED DESCRIPTION OF THE PREFERRED EMBODIMENTS

An example of a circuit characteristic adjusting method, which constitutes a preferred embodiment of the invention, will be described with reference to FIGS. 1 through 4.

Figure 1:
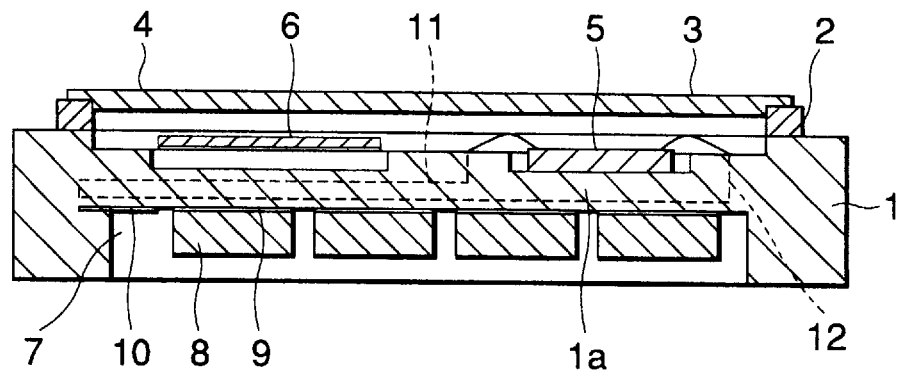
FIG. 1 is a sectional view of a circuit body for a description of a circuit characteristic adjusting method according to the invention.
Figure 2:
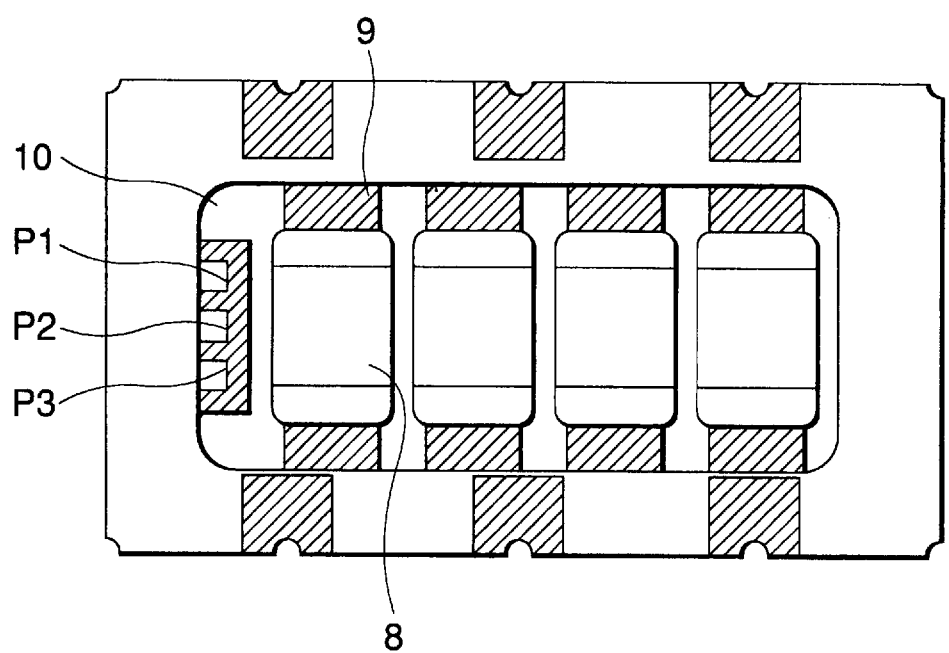
FIG. 2 is a plan view of the circuit body for a description of the example of the circuit characteristic adjusting method according to the invention.

In FIGS. 1 and 2, reference 1 designates a so-called "ceramic container" made of multi-layer ceramic substrate; 2, a seam ring made of cobar (Fe—Ni—Co alloy) material which is mounted on the ceramic container 1; and 3, a lid of cobar material which is welded to the seam ring 2 by seam sealing. Those components 1, 2 and 3 form a sealed chamber 4. Before the sealed chamber 4 is formed in this manner, an IC circuit chip 5, and a crystal oscillator 6 have been mounted therein.

The ceramic container 1 has a recess 7 in the lower surface, in which so-called passive chip components 8 are mounted. In the recess 7, a pattern 10 are provided which, similarly as in the case of another pattern 9, are formed by metallizing and to be cut when necessary. The pattern 10 is connected to the IC circuit 5 as indicated by dotted lines 11, 12 and 13 (the dotted line 13 not shown), thus being electrically connected to elements in the IC circuit 5 which are to be selected.

Figure 3:
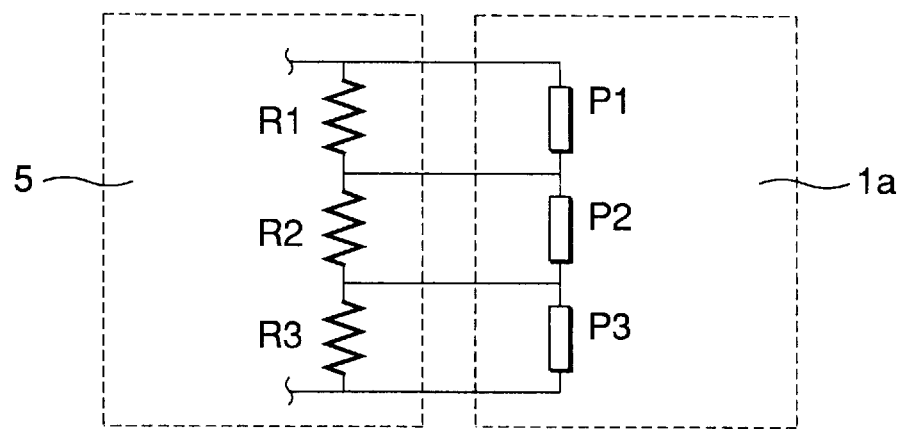
FIG. 3 is a diagram for a description of an example of the circuit characteristic adjusting method.

Now, with respect to the above-described circuit body, the circuit characteristic adjusting method will be described. By way of example, it is assumed that elements of the IC circuit 5 are resistor elements. As shown in FIG. 3, the IC circuit 5 includes a series circuit of resistor elements R1, R2 and R3, which are connected to patterns P1, P2, and P3 on the substrate 1a of the ceramic container 1. If, in this case, the pattern P1 is cut, then the resultant combined resistance is of the resistor elements on the wiring lines which includes the resistor elements R1, R2 and R3 and the patterns P2 and P3. If, in this case, it is assumed that the resistance value of the elements on the wiring lines including the patterns P1, P2 and P3 is much lower than the internal resistance of the IC circuit 5, and therefore does not affect the function of the latter, the cutting of the pattern P1 is substantially equivalent to the selection of the resistor element R1 only. If the thought is advanced in this way, eight kinds of selection can be obtained when cut points are selected and added up including the case where no cutting is carried out. Hence, eight kinds of functions of those resistor elements can be selected. In the above-described embodiment, the number of resistor elements is only three; however, the invention is not limited thereto or thereby. That is, a plurality of resistor elements may be employed.

Figure 4:
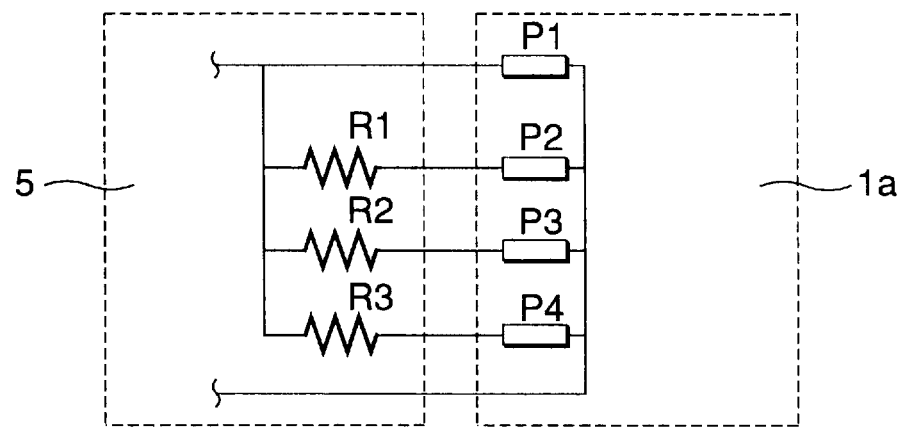
FIG. 4 is a diagram for a description of another example of the circuit characteristic adjusting method.

Furthermore, as shown in FIG. 4, the resistor elements in the IC circuit 5 may be arranged so that they are parallel-connected to one another.

In the above-described embodiment, the resistor elements are employed; however, the invention is not limited thereto or thereby. That is, instead of the resistor elements, other elements such as capacitors may be employed, or functional elements may be applied.

The pattern 10 is cut as follows: The IC circuit 5 and the crystal oscillator 6 are mounted and sealed, and the other components 8 are mounted. That is, the assembling work is carried out until the circuit body becomes active in function. The resultant circuit body is confirmed in characteristic, and according to the characteristic, the resistor elements R1, R2 and/or R3 is selected, and the patterns P1, P2 and/or P3 is cut when necessary. The cutting pattern 10 on the substrate 1a is formed by plating Ni, and Au on a tungsten metallized member. The cutting pattern 10 can be readily cut with a laser beam. The use of a laser beam is excellent in work circumference, fine machining, and control characteristics.

In the embodiment, the cutting pattern 10 is provided in the recess 7; however, the invention is not limited thereto or thereby. That is, it may be provided freely at any place which can be suitably utilized.

In the circuit characteristic adjusting method according to the invention, the adjusting elements are redundantly or preliminarily built in an IC circuit body in advance, the adjusting elements are connected to one another through conductor patterns provided outside the circuit body, and after the operating function of the circuit body is confirmed by inspection, the conductor patterns are selectively cut to select an adjusting element to be used, thereby to adjust or select a function of the circuit body. Hence, the connection of the element components to be adjusted in the IC circuit body may be carried out outside the circuit body, for instance with the conductor patterns on the substrate. That is, the characteristic of the conductor patterns is confirmed which have been assembled until other elements which are delicate with the circumferential change under the condition that the connection of the elements in the circuit body is substantially maintained, and the wiring condition is selective. Thereafter, a suitable pattern to be cut is selectively cut. Hence, the space for installation of the element components may be small, and the adjustment work can be achieved with ease.

Furthermore, with the connection of the internal elements of the IC circuit provided outside thereof, the adjustment work is performed by cutting under the condition that the operating function characteristic is completely confirmed. Hence, the adjustment can be achieved without adversely affecting the elements forming the IC circuit body, and other element built therein together with the circuit body.

What is claimed is:

1. A circuit characteristic adjusting method comprising the steps of:

building adjusting elements in an IC circuit body, connecting said adjusting elements to one another through conductor patterns provided outside said circuit body, and selectively cutting to said conductor patterns to select an adjusting element to be used after the operating function of said circuit body is confirmed by inspection, thereby to adjust or select a function of said circuit body.

* * * * *